United States Patent
Mathe et al.

(10) Patent No.: US 6,347,123 B1
(45) Date of Patent: Feb. 12, 2002

(54) LOW-CURRENT SAMPLE RATE CONVERTER

(75) Inventors: Lennart Mathe; Daniel T. Macek, both of San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/119,073

(22) Filed: Jul. 10, 1998

(51) Int. Cl.[7] ............................................... H04L 27/14

(52) U.S. Cl. ..................... 375/324; 375/340; 341/88; 341/108; 341/110; 341/123; 341/126

(58) Field of Search ................................. 375/225, 324, 375/328, 335, 340; 341/88, 108, 110, 122, 123, 126, 148

(56) References Cited

U.S. PATENT DOCUMENTS

| | | | | |
|---|---|---|---|---|
| 5,481,267 A | * | 1/1996 | Miyabe et al. | 341/61 |
| 5,481,563 A | * | 1/1996 | Hamre | 375/226 |
| 5,559,513 A | * | 9/1996 | Rothermel et al. | 341/61 |
| 6,061,410 A | * | 5/2000 | Linz | 375/371 |

\* cited by examiner

Primary Examiner—Stephen Chin
Assistant Examiner—Dac V. Ha
(74) Attorney, Agent, or Firm—Philip Wadsworth; Charles D. Brown; Christopher Edwards (57) ABSTRACT

A low power sample rate converter adapted for use with a telecommunications system transceiver. The sample rate converter includes a first circuit that provides an input signal characterized by a first sample rate and a delayed version of the input signal. A second circuit periodically multiplies, at a second sample rate, samples in the input signal by a first predetermined coefficient in accordance with a predetermined transfer function and provides a first signal in response thereto. A third circuit periodically multiplies, at the second sample rate, samples in the delayed version of the input signal by a second predetermined coefficient in accordance with the predetermined transfer function and provides a second signal in response thereto. A fourth circuit combines the first signal and second signal providing a rate-converted version of the input signal as an output signal in response thereto. In a specific embodiment, the delayed version of the input signal is delayed by one sample with respect to the input signal. The sample rate converter further includes a counter that is clocked by a first periodic signal. The first periodic signal has a frequency related to the first sample rate by a predetermined fraction. The counter is cleared by a second periodic signal having a second frequency equivalent to the first sample rate. The counter produces a counter output at the first frequency. In the preferred embodiment, the predetermined fraction is ⅓ and the first predetermined coefficient is equivalent to the sum of 1 and the counter output. The second predetermined coefficient is equivalent to the difference of 2 and the counter output. The fourth circuit includes an adder for adding the first signal and the second signal and providing the output signal in response thereto. The predetermined transfer function is represented by the following coefficient sequence: [1 2 3 2 1].

36 Claims, 8 Drawing Sheets

LOW-CURRENT SAMPLE RATE CONVERTER

BACKGROUND OF THE INVENTION

1. Field of Invention

This invention relates to multi-rate digital signal processing systems. Specifically, the present invention relates systems for effecting sample rate conversion of a digital signal.

2. Description of the Related Art

Telecommunications systems that transmit and receive different types of signals such as facsimile, speech and video signals must often process various signals at different rates commensurate with the bandwidths of the corresponding signals. The process of converting a signal from a given rate to a different rate is called sample rate conversion. Systems that employ multiple sampling rates in the processing of digital signals are called multi-rate digital signal processing systems.

Multi-rate systems typically employ one of two general methods to effect sample rate conversion. One method involves passing the digital signal through a digital-to-analog converter (DAC) and then re-sampling the resulting analog signal at the desired rate via an analog-to-digital converter (ADC). However, this method often results in undesirable signal distortion introduced by the DAC during signal reconstruction and by quantization effects during analog-to-digital conversion.

These problems are typically avoided by a second method that involves performing the sample rate conversion entirely in the digital domain via a digital sample rate converter. One type of digital sample rate converter is a direct-form finite impulse response (FIR) filter. The filter adjusts an input sample rate $F_s$ by a factor of I/D and includes an up-sampler connected in series to a lowpass filter, the output of which is connected to a down-sampler. The up-sampler interpolates, i.e., up-converts the input sample rate by a factor I. The low-pass filter removes resulting undesirable spectral images and the down-sampler decimates, i.e., down-converts, the resulting interpolated signal by a factor D. The up-sampling performed by the up-sampler introduces I-1 zeros between successive samples of the input signal. If I is large, most of the signal components in the FIR filter are zero. Consequently, most of the filter computations including multiplications and additions result in zeros, representing wasted power. Furthermore, while the filter performs computations on all samples, only one out of every D output samples is required at the output of the filter. This represents additional filter inefficiency.

More efficient FIR sample rate converters are known, however, sample rate conversion is still typically realized by inserting I-1 zeros between input samples and then filtering the resulting sequence. In addition, the filter computations are performed at the high sampling rate of $I*F_s$, where $F_s$ is the sample rate of the signal input to the FIR sample rate converter. The high sampling rate results in large power consumption.

A second type of digital sample rate converter is implemented via polyphase filters. The polyphase filter computations are performed at the relatively low sampling rate of $F_s$. However, polyphase sample rate converters designed to adjust the input sample rate $F_s$ by a factor of I/D require a bank of at least I polyphase filters. The requirement often results in computationally inefficient, space inefficient, and energy inefficient sample rate converters. These disadvantages are particularly problematic in applications such as cellular telephones used in digital telecommunications systems where size and power consumption are of paramount importance.

Cellular telecommunications systems are characterized by a plurality of mobile transceivers in communication with one or more base stations. Each transceiver includes a transmitter and a receiver. In a typical transceiver, an analog radio frequency (RF) input signal, received by an antenna, is downconverted by an RF section to an intermediate frequency (IF). Signal processing circuits perform noise filtering and adjust the magnitude of the signal via analog automatic gain control (AGC) circuitry. An IF section then mixes the signal down to baseband and converts the analog signal to a digital signal. The digital signal is then input to a baseband processor for further signal processing to output voice or data.

Similarly, the transmitter receives a digital input from the baseband processor and converts the input to an analog signal. This signal is then filtered and upconverted by an IF stage to an intermediate frequency. The gain of the transmit signal is adjusted and the IF signal is upconverted to RF in preparation for radio transmission.

In both the transmit and receive sections, signal gain adjustment and mixing is typically performed in the analog domain. This necessitates the use of a plurality of local oscillators (LOs) and low-pass filters for signal downconversion, upconversion, and mixing. Analog local oscillators tend to be bulky and require the use of one or more phase-locked loops. As is well known in the art, phase-locked loops are large, expensive circuits that consume a considerable amount of power. In addition, the requisite analog gain circuits and mixers are especially prone to undesirable gain and phase mismatch and the analog low-pass filters are expensive to implement.

Hence, a need exists in the art for a computationally-efficient, power-efficient and space-efficient sample rate converter. There is a further need for an efficient transceiver that maximizes the benefits of the efficient sample rate converter and eliminates the need for analog baseband-to IF-mixers and gain control circuits.

SUMMARY OF THE INVENTION

The need in the art is addressed by the low power sample rate converter of the present invention. In the illustrative embodiment, the inventive sample rate converter is adapted for use with a telecommunications system transceiver and includes a first circuit for providing an input signal characterized by a first sample rate. The first circuit also provides a delayed version of the input signal. A second circuit periodically multiplies, at a second sample rate, a first sample in the input signal by a first predetermined coefficient in accordance with a predetermined transfer function and provides a first signal in response thereto. A third circuit periodically multiplies, at the second sample rate, a second sample in the delayed version of the input signal by a second predetermined coefficient in accordance with the predetermined transfer function and provides a second signal in response thereto. A fourth circuit combines the first signal and second signal and provides a rate-converted version of the input signal as an output signal in response thereto.

In a specific embodiment, the delayed version of the input signal is delayed by one sample with respect to the input signal. The sample rate converter further includes a counter. The counter is clocked by a first periodic signal having a first frequency related to the first sample rate by a predetermined fraction. The counter is cleared by a second periodic signal having a second frequency equivalent to the first sample rate. The counter produces a counter output at the first frequency. In the preferred embodiment, the predetermined fraction is ⅓ and the first predetermined coefficient is equivalent to the sum of 1 and the counter output. The second predetermined coefficient is equivalent to the difference of 2 and the counter output.

The fourth circuit includes an adder for adding the first signal and the second signal and providing the output signal in response thereto. In an exemplary embodiment, the predetermined transfer function is:

$$(1+z^{-1}+z^{-2})^2$$

The predetermined transfer function is represented by the following coefficient sequence: [1 2 3 2 1].

The sample rate converter includes a clock that generates a first clock signal. An input circuit receives the input signal. An enable circuit compares the first clock signal to the input signal and provides an enable signal when the input signal is stable near an edge of a clock pulse in the first clock signal. The counter receives the first clock signal as an input and increments a count for each clock pulse received via the first clock signal. The count is reset with the clock of the input sample stream.

In the illustrative embodiment, the sample rate converter is implemented in a telecommunications system transceiver that includes an antenna for receiving a radio signal having a first frequency. A mixer mixes the radio signal to an intermediate frequency signal. A delta-sigma analog-to-digital converter converts the intermediate frequency signal to a digital intermediate frequency signal. A digital filter converts the digital intermediate frequency signal to a digital baseband signal. A baseband processor processes the digital baseband signal and outputs a signal. A transmitter transmits the signal. The baseband processor demodulates and/or despreads the digital baseband signal. The digital filter rejects jammer signals in the digital baseband signal and includes the low power sample rate converter of the present invention.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
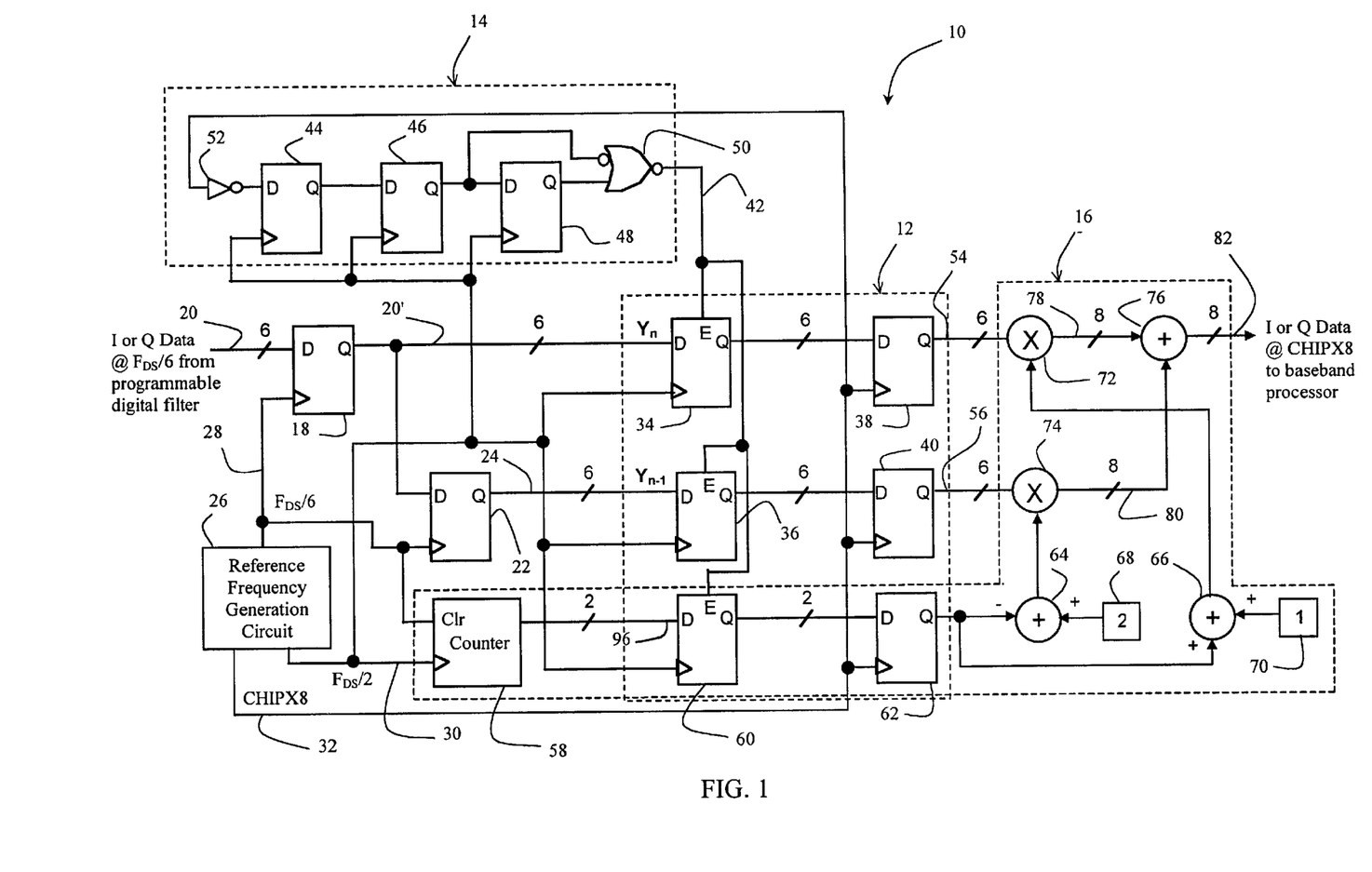
FIG. 1 is a diagram of a sample rate converter constructed in accordance with the teachings of the present invention and including a sample rate conversion circuit, a sample rate conversion enable circuit, and a low-pass filter circuit.

FIG. 1 is a diagram of a sample rate converter constructed in accordance with the teachings of the present invention. The converter 10 includes a sample rate conversion circuit 12, a sample rate conversion enable circuit 14, and a low-pass filter circuit 16. A first register 18 provides a $Y_n$ input 20 to the rate conversion circuit 12. In-phase (I) or quadrature (Q) data output from a programmable digital filter (as discussed more fully below) provides input to the first register 18 at a sample rate of F__/6. A second register 22 receives the $Y_n$ input 20 and outputs a $Y_{n-1}$ input 24 to the rate conversion circuit 12. The $Y_{n-1}$, input 24 is equivalent to the $Y_n$ input 20 but is delayed by one sample corresponding to a time interval of $(F\_/6)_{-1}$.

A reference frequency generation circuit 26 is connected to the sample rate conversion circuit 12, the sample rate conversion enable circuit 14, the low-pass filter circuit 16, the first register 18, and to the second register 22. The enable circuit 14 is connected to the rate conversion circuit 12 and the low-pass filter circuit 16. The reference frequency generation circuit 26 provides reference frequencies to the sample rate conversion circuit 12, the sample rate conversion enable circuit 14, the low-pass filter circuit 16, the first register 18, and to the second register 22. In the present embodiment, the reference frequency generation circuit 26 generates an F__/6 clock signal 28, an F__/2 clock signal 30, and a CHIP×8 clock signal 32 having frequencies of F__/6, F__/2, and CHIP×8, respectively. F__ is the sample rate of a preceding delta-sigma (__) analog-to-digital converter (is discussed more fully below), and CHIP×8 is the chip rate of the system in which the rate converter 10 is employed. In the present embodiment, CHIP×8 is the clock rate of a subsequent baseband processor (as discussed more fully below).

Those skilled in the art will appreciate that the CHIP×8 clock signal 32 may be a arbitrary clock signal from an outside source not controllable by the sample rate converter 10 without departing from the scope of the present invention. The sample rate converter 10 can adjust the input sample rate by an arbitrary factor and is not restricted to adjusting the input sample rate by a factor of I/D where I and D are integers, as is the case with most conventional sample rate converters.

The sample rate conversion circuit 12 includes a first selectively enabled register 34 and a second selectively enabled register 36, both of which are clocked by the F__/2 clock signal 30. The first and second selectively enabled registers 34 and 36, respectively, receive the $Y_n$ input 20 and the $Y_{n-1}$ input 24, respectively. Outputs of the first and second selectively enabled registers 34 and 36, respectively, are connected to the inputs of a first rate conversion register 38 and a second rate conversion register 40, respectively.

The first rate conversion register 38 and the second rate conversion register 40 are clocked by the CHIP×8 clock signal 32.

The first selectively enabled register 34 and the second selectively enabled register 36 are connected to the output of the rate conversion enable circuit 14 and selectively enabled thereby. The rate conversion enable circuit 14 includes a first enable register 44, a second enable register 46, and a third enable register 48, all connected in series and clocked by the F_/2 clock signal 30. An output of the second enable register 46 is connected to a negated input of a NOR gate 50. The second input of the NOR gate 50 is connected to an output of the third register 48. (The NOR gate 50 is equivalent to an AND gate with the opposite input negated as is illustrated by De Morgan's Law that states: (A'+B)'= (A*B').) The output of the NOR gate 50 provides an enable signal 42. An inverter 52 is connected to the input of the first enable register 44 and negates the CHIP×8 clock signal 32 before inputting it to the first enable register 44.

In operation, a falling edge of a clock pulse in the CHIP×8 clock signal 32 triggers a high voltage state, such as 3 to 5 volts or a logical 1, at the input of the first enable register 44. Initially, low voltage states exist at the outputs of the first enable register 44, the second enable register 46, and the third enable register 48. At a subsequent F_/2 clock pulse from the F_/2 clock signal 30, the high voltage state at the input of the first enable register 44 is transferred to the output of the first enable register 44. Initially, the output of the second enable register 46 and the output of the third register 48 are at low voltage states and hence, the enable signal 42 at the output of the NOR gate 50 is also low. This is due to the fact that the output of the second enable register 48 is negated before being input to the NOR gate 50.

At a subsequent F_/2 clock pulse from the F_/2 clock signal 30, the high voltage state at the output of the first enable register 44 is transferred to the output of the second enable register 46. A low voltage state remains at the output of the third enable register 48. The high voltage state at the output of the second enable register 46 and the low voltage state at the output of the third enable register 48 result in a high voltage state in the enable signal 42 at the output of the NOR gate 50.

At a subsequent F_/2 clock pulse from the F_/2 clock signal 30, the high voltage state at the output of the second enable register 44 is transferred to the output of the third enable register 48. The high voltage state at the output of the third enable register 48 causes a low voltage state in the enable signal 42 at the output of the NOR gate. The above operations ensure that the enable signal 42 is high just after the falling edge of a pulse in the CHIP×8 clock signal 32 and subsequently remains low until another falling edge of a pulse in the CHIP×8 clock signal 32. Hence, the enable signal 42 is low near a rising edge of pulses in the CHIP×8 clock signal 32. This is facilitated by the fact that F_/2 clock signal 30 is a higher frequency signal than the CHIP×8 clock signal 32.

The rate conversion enable circuit 14 is an edge detection circuit that detects a falling edge of a pulse in the CHIP×8 clock signal 32 and outputs the enable signal 42 in response thereto. An enable pulse in the enable signal 42 is generated just after the rising edge of a pulse in the F_/2 clock signal 30 and after the falling edge of a pulse in the CHIP×8 clock signal 32. The enable pulse in the enable signal 42 is low near the rising edge of the CHIP×8 clock signal 32.

Use of the enable signal 42 by the first, second, and third selectively enabled registers 34, 36, and 60 respectively, ensures that data in the $Y_n$ input 20, the $Y_{n-1}$ input 24, and data in a counter output 96 are stable near the rising edge of a pulse in the CHIP×8 clock signal 32. This is required so that the first, second, and third rate conversion registers 34, 26, and 60, respectively, clocked by the CHIP×8 clock signal 32, operate on stable data that is in the correct relative sequence, i.e., $Y_n$ data and $Y_{n-1}$ data, and not, for example, $Y_n$ data and $Y_{n-2}$ data, respectively. The first, second, and third rate conversion registers 34, 26, and 60, respectively, are rising-edge triggered registers.

The first selectively enabled register 34 and the second selectively enabled register 36 are clocked by the F_/2 clock signal 30 receive the $Y_n$ input 20 and the $Y_{n-1}$ input 24 having sample rates of F_/6, respectively. The first selectively enabled register 34 and second selectively enabled register 36 provide input to the first rate conversion register 38 and the second rate conversion register 40, both clocked by the CHIP×8 clock signal 32. The first rate conversion register 38 and the second rate conversion register 40 provide a first $Y_n$ rate-converted output signal 54 and a second $Y_{n-1}$ rate-converted output signal 56, respectively, at sample rates of CHIP×8.

The first $Y_n$ rate-converted output signal 54 and the second $Y_{n-1}$ rate-converted output signal 56 are input to the low-pass filter circuit 16. The low-pass filter circuit 16 includes a 2-bit counter 58, an output 96 of which is connected to the input of a third selectively enabled register 60 that is also enabled by the enable signal 42. The output of the third selectively enabled register 60 is connected to a third rate conversion register 62. The output of the third rate conversion register 62 is connected to a negative terminal of a subtractor 64 and to one terminal of an adder 66. A first constant circuit 68 is connected to the positive terminal of the subtractor 64. The first constant circuit 68 provides a value that is the voltage equivalent of 2 in the present embodiment, to the subtractor 64. A second constant circuit 70 provides the equivalent of a 1 to the second terminal of the adder 66. The output of the adder 66 is connected to one input of a first multiplier 72, the other input of which is connected to the first $Y_n$ rate-converted output signal 54 from the rate conversion circuit 12. The output of the subtractor 64 is connected to an input of a second multiplier 74, the other input of which is connected to the second $Y_{n-1}$, rate-converted output signal 56 from the rate conversion circuit 12. The outputs of the first multiplier 72 and the second multiplier 74 are input to an output adder 76.

Those skilled in the art will appreciate that the first constant circuit 68, the second constant circuit 70, the first adder 64, and the second adder 66 may be replaced with a multiplexer without departing from the scope of the present invention.

In operation, the counter 58 is clocked by the F_/2 clock signal 30 and cleared by the F_/6 clock signal 28. On every third F_/2 pulse, the counter 58 is cleared by an F_/6 pulse. Hence, the counter 58 counts from zero to two, is reset, and then counts from zero to two, and so on, at a frequency of F_/2. The counter 58 completes one cycle counting from zero to two for every sample of I or Q data input to the first register 18, i.e., completes one cycle every $(F\_/6)_{-1}$ seconds. Hence, two out of the three counts (0, 1, 2) of the counter 58 occur when no sample is present in the $Y_n$ input signal 20 or the $Y_{n-1}$ input signal 24. This allows the low-pass filter circuit 16 to simulate zero insertion in the input $Y_n$ input signal 20 or the $Y_{n-1}$ input signal 24 without actually inserting zeros in the input signals 20 and 24.

The third selectively enabled register 60 ensures that the output of the counter 58 is stable near the rising edge of a pulse in the CHIP×8 clock signal 32, which clocks the third rate conversion register 62. The output of the third rate conversion register 62 is either 0, 1, or 2 depending on when the rising edge of a clock pulse in the CHIP×8 clock signal 32 occurred during the counting process. The rates of the F_/2 clock signal 30 and the F_/6 clock signal 28, as well as the constants provided by the first constant circuit 68 and the second constant circuit 70 are selectively chosen to provide digital filtering in accordance with a predetermined transfer function. The versatility of the sample rate converter 10 is enhanced by the fact that the CHIP×8 clock signal 32 may have an arbitrary frequency.

The third rate conversion register 62 outputs a count, either 0, 1, or 2, after every rising edge of a pulse in the CHIP×8 clock signal 32. One is added to the count by the adder 66 and the sum is input to the first multiplier 72. The first multiplier 72 multiplies the sum by the first $Y_n$ rate-converted output signal 54 and outputs a first product 78 in response thereto to the adder 76. The count is subtracted from two by the subtractor 64 and the resulting difference is input to the second multiplier 74. The second multiplier 74 multiplies the difference by the second $Y_{n-1}$ rate-converted output signal 56 and outputs a second product 80 in response thereto to the output adder 76. The output adder 76 adds the first product 78 and the second product 80 and provides a sample rate converter output signal 82 in response thereto.

The computations performed by the subtractor 64, the adder 66, the first multiplier 72, the second multiplier 74, and the output adder 76 on the selectively provided count at the output of the third rate conversion register 62 implement a filter with the following transfer function:

$$(1+z^{-1}+z^{-2})^2 \qquad [1]$$

Multiplying a digital input signal by the transfer function of equation [1] is equivalent multiplying the input signal by the following sequence of constants [1 2 3 2 1].

Those skilled in the art will appreciate that the transfer function of equation (1) may be replaced with another transfer function without departing from the scope of the present invention such as a function that depends on several factors including: the ratio between F_/2 and F_/6, the bandwidth of the $Y_n$ input signal 20, and the required attenuation of the spectral images in the $Y_n$ input signal 20. In addition, those ordinarily skilled in the art may construct the reference frequency generation circuit 26 using simple frequency dividers and a crystal oscillator. The frequency dividers may be implemented with direct digital synthesizers which are often more energy-efficient and space-efficient than analog counterparts. Also, the registers 18, 22, 34, 36, 38, 40, 44, 46, 48, 60, and 62 are implemented with rising-edge triggered DQ flip flops, which are well known in the art. In addition, the counter 58 is easily constructed by those ordinarily skilled in the art.

Figure 2:
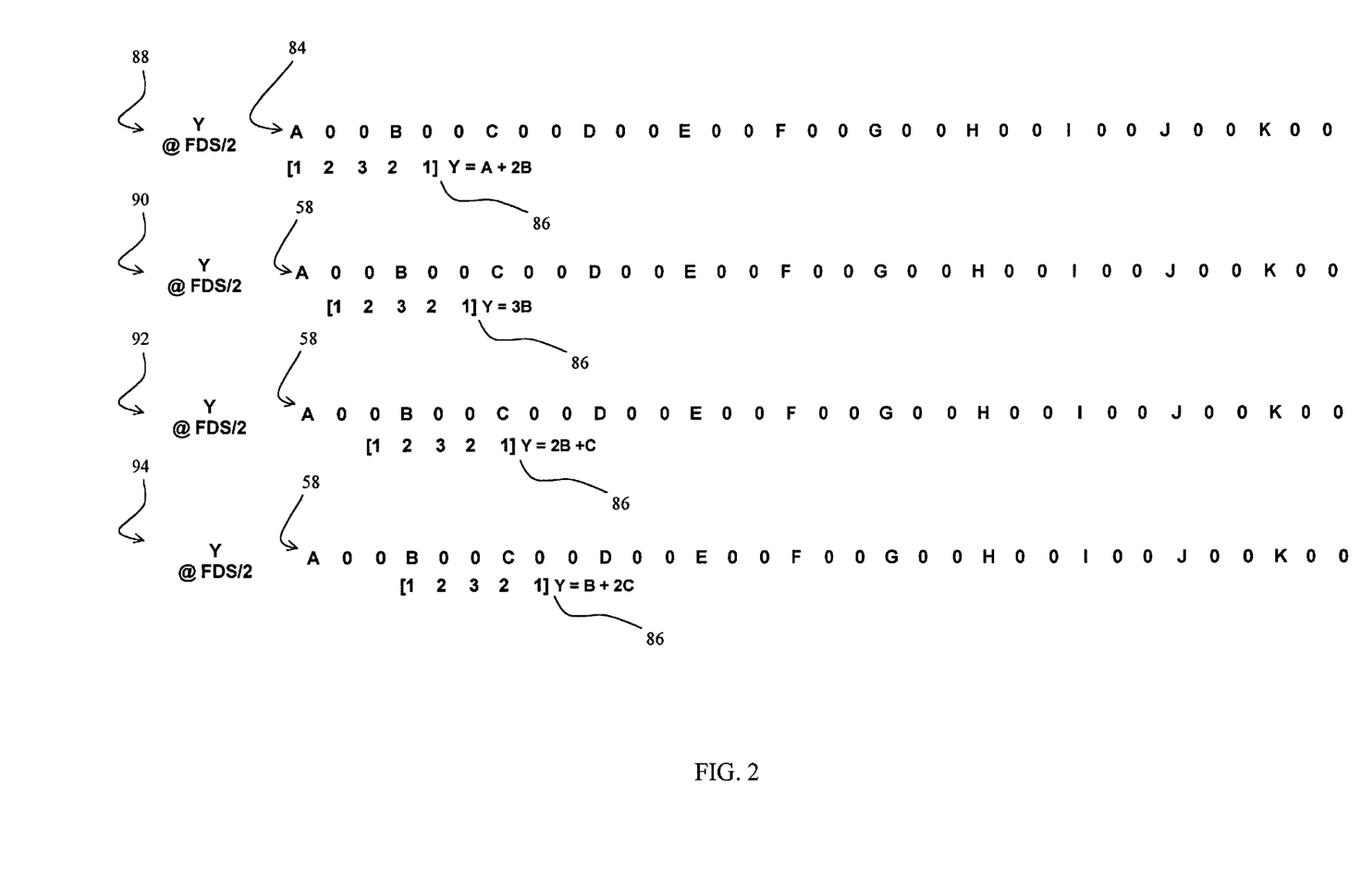
FIG. 2 diagram showing an exemplary input sequence $Y_n$ to the low-pass filter circuit of FIG. 1, and the effect of multiplying the sequence $Y_n$ by the digital low-pass filter coefficients of the low-pass filter circuit of FIG. 1.

FIG. 2 is a diagram showing an exemplary input sequence $Y_n$ 84 to the ample rate converter of FIG. 1 after interpolation by a factor of three via zero insertion. The input sequence $Y_n$ 84 is presented for illustrative purposes only to show that the sample rate converter of FIG. 1 can simulate the effects of zero insertion without the requirement of actually inserting zeros in the bit stream corresponding to the $Y_n$ input 20 of FIG. 1.

FIG. 2 illustrates the effect of multiplying the sequence $Y_n$ 84 by a digital low-pass filter coefficient sequence 86 of the low-pass filter circuit of FIG. 1. A first scenario 88, a second scenario 90, a third scenario 92 and a fourth scenario 94 are shown wherein the filter sequence 86 is multiplied with a different portion of the exemplary input sequence $Y_n$ 84. The filter coefficient sequence 86 corresponds to the transfer function of equation [1].

With reference to FIG. 1, the exemplary input sequence $Y_n$ 84 corresponds to the output of the first selectively enabled register 34. However, the output of the first selectively enabled register 34 does not actually have zeros inserted therein. While the selectively enabled registers 34 and 36 are clocked at a rate of F_/2, only every third pulse in the $Y_n$ input 20 contains data for use by the low-pass filter circuit 16, i.e., A, B, C . . . as is shown in the exemplary input sequence $Y_n$ 84 and represented by the sequence [A 0 0 B 0 0 C 0 0 D 0 0 E . . . ].

In the first scenario 88, the result of the multiplication of the filter coefficient sequence 86 with the exemplary input sequence $Y_n$ 84 is A+2B. In the second scenario 90, the filter coefficient sequence 86 is shifted to the right by one (F_/2)$_{-1}$ time interval. The resulting product of the filter coefficient sequence 86 with the exemplary input sequence $Y_n$ 84 is 3B. Similarly, in the third scenario 92, the filter coefficient sequence 86 is shifted to the right by an additional (F_/2)$_{-1}$ time interval. The resulting product of the filter coefficient sequence 86 with the exemplary input sequence $Y_n$ 84 is 2B+C. Likewise, in the fourth scenario 94, the filter coefficient sequence 86 is shifted to the right by an additional (F_/6)$_{-1}$ time interval. The resulting product of the filter coefficient sequence 86 with the exemplary input sequence $Y_n$ 84 is B+2C.

The above scenarios, 88, 90, 92, and 94 illustrate an algorithm implemented by the low-pass filter circuit 16 of FIG. 1. The algorithm involves picking the two most recent samples of the $Y_n$ input 20 of FIG. 1 ($Y_n$ and $Y_{n-1}$ as discussed more fully below) and multiplying the samples by an appropriate filter coefficient, i.e., either 1, 2, or 3, corresponding to coefficients in the filter coefficient sequence 86. For example, in the first scenario 88, the first most recent sample ($Y_n$) is B, the second most recent sample ($Y_{n-1}$) is A, and the appropriate coefficients are 2 and 1, respectively.

Figure 3:
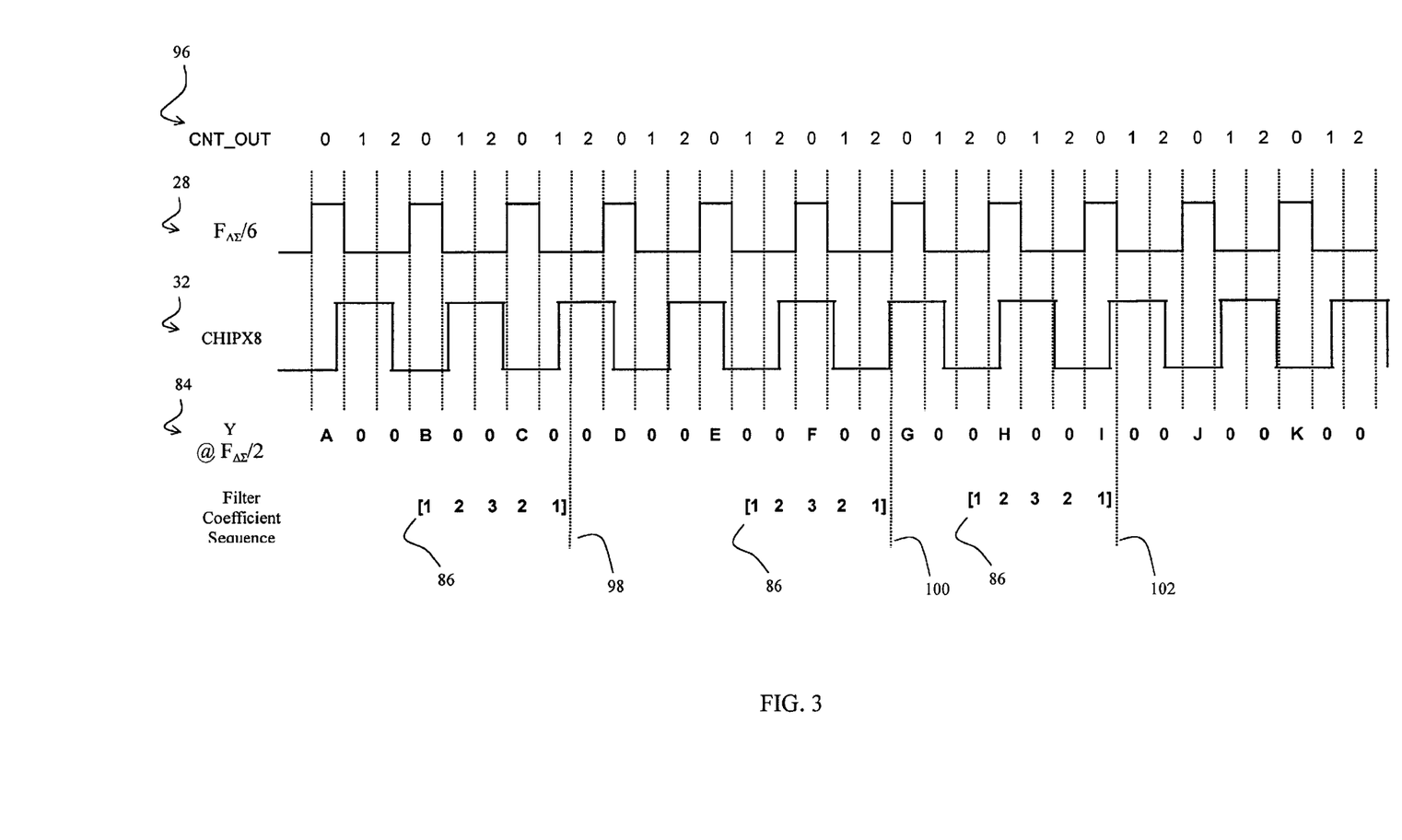
FIG. 3 is a timing diagram comparing a clock signal corresponding to the sample rate (F__/6) of a sample rate converter input sequence $Y_n$ to a clock signal corresponding to the desired output sample rate (chip rate) of the sample rate converter of FIG. 1.

FIG. 3 is a timing diagram juxtaposing the F_/6 clock signal 28, the CHIP×8 clock signal 32, and the counter output 96 of FIG. 1, and the exemplary input sequence 84 and filter coefficient sequence 86 of FIG. 2. The F_/6 clock signal 28 has a frequency corresponding to the sample rate of the input sequence $Y_n$ 20 of FIG. 1. The CHIP×8 clock signal 32 has a frequency corresponding to the desired output sample rate (chip rate) of the sample rate converter of FIG. 1.

With reference to FIG. 1, the selectively enabled registers 34, 36, and 60 are enabled after the falling edge of each pulse in the CHIP×8 clock signal 32 via the enable signal 42. The selectively enabled registers 34 and 36 however, do not change their values in response only to a falling edge of a pulse in the CHIP×8 clock signal 32. The outputs of the selectively enable registers 34 and 36 are either A, B, or C in the present example, and change values only after the falling edges of pulses in the CHIP×8 clock signal 32 and after rising edges of their F_/2 clock signal 30. This is illustrated in FIG. 3 where each pulse in the F_/6 clock signal 28 occurs in sequence with data such as A, B, C . . . in the exemplary input sequence 84.

The values of the counter output 96, i.e., 0, 1, and 2 are used to determine the appropriate coefficients with which to multiply the most recent two samples corresponding to the first $Y_n$ rate-converted output signal 54 and the second $Y_{n-1}$ rate-converted output signal 56 of FIG. 1.

When the filter coefficient sequence 86 is at a first position 98 with respect to the exemplary input sequence 84, the desired sample rate converter output signal 82 Y is: Y=2C+B. This is equivalent to: Y=(1+CNT_OUT)*C+(2−CNT_OUT)*B, where CNT_OUT is the value of the counter output 96 at the first position 98 and is 1.

Similarly, when the filter coefficient sequence 86 is at a second position 100 with respect to the exemplary input sequence 84, the desired sample rate converter output signal 82 Y is: Y=3F. This is equivalent to: Y=(1+CNT_OUT)*F+ (2−CNT_OUT)*E, where CNT_OUT is the value of the counter output 96 at the second position 100 and is 2.

Likewise, when the filter coefficient sequence 86 is at a third position 102 with respect to the exemplary input sequence 84, the desired sample rate converter output signal 82 Y is: Y=I+2H. This is equivalent to: Y=(1+CNT_OUT) *I+(2−CNT_OUT)*H, where CNT_OUT is the value of the counter output 96 at the third position 102 and is 0.

From the above examples, it is evident that a general expression for the desired sample rate converter output signal 82 Y is:

$$Y=(CNT\_OUT+1)*Y_n+(2-CNT\_OUT)*Y_{n-1} \qquad [2]$$

where CNT_OUT is the current counter output 96, $Y_n$ is the first $Y_n$ rate-converted output signal 54 and $Y_{n-1}$ is the second $Y_{n-1}$ rate-converted output signal 56 at sample rates of CHIP×8. Hence, the low-pass filter circuit 16 of FIG. 1 can perform requisite filtering as if zero-insertion were performed without inserting zeros in a bit-stream. This is computationally efficient and results in low power consumption.

Note that the first position 98, the second position 100 and the third position 102 are after the rising edge of a pulse in the CHIP×8 clock signal 32, which is when the rate conversion registers 38, 40, and 62 are activated by the CHIP×8 clock signal 32.

Figure 4:
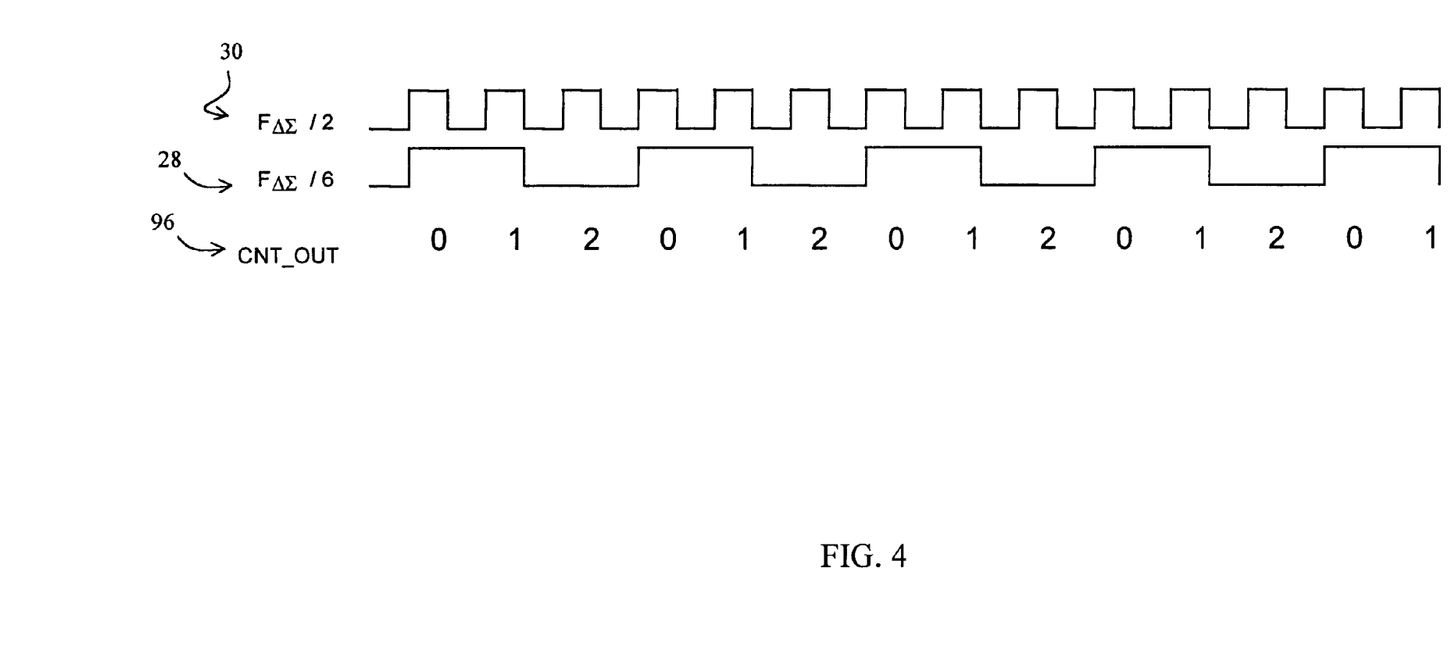
FIG. 4 is a timing diagram comparing an F__/2 clock signal, an F__/6 clock signal, and the output of a counter circuit included in the lowpass filter circuit of FIG. 1.

FIG. 4 is a timing diagram comparing the F_/2 clock signal 30, the F_/6 clock signal 28, and the counter output 96 of FIG. 1. The counter output 96 is reset to zero after the rising edge of each F_/6 clock signal 28, and increments its count at the rising edge of each pulse in the F_/2 clock signal 30.

Figure 5:
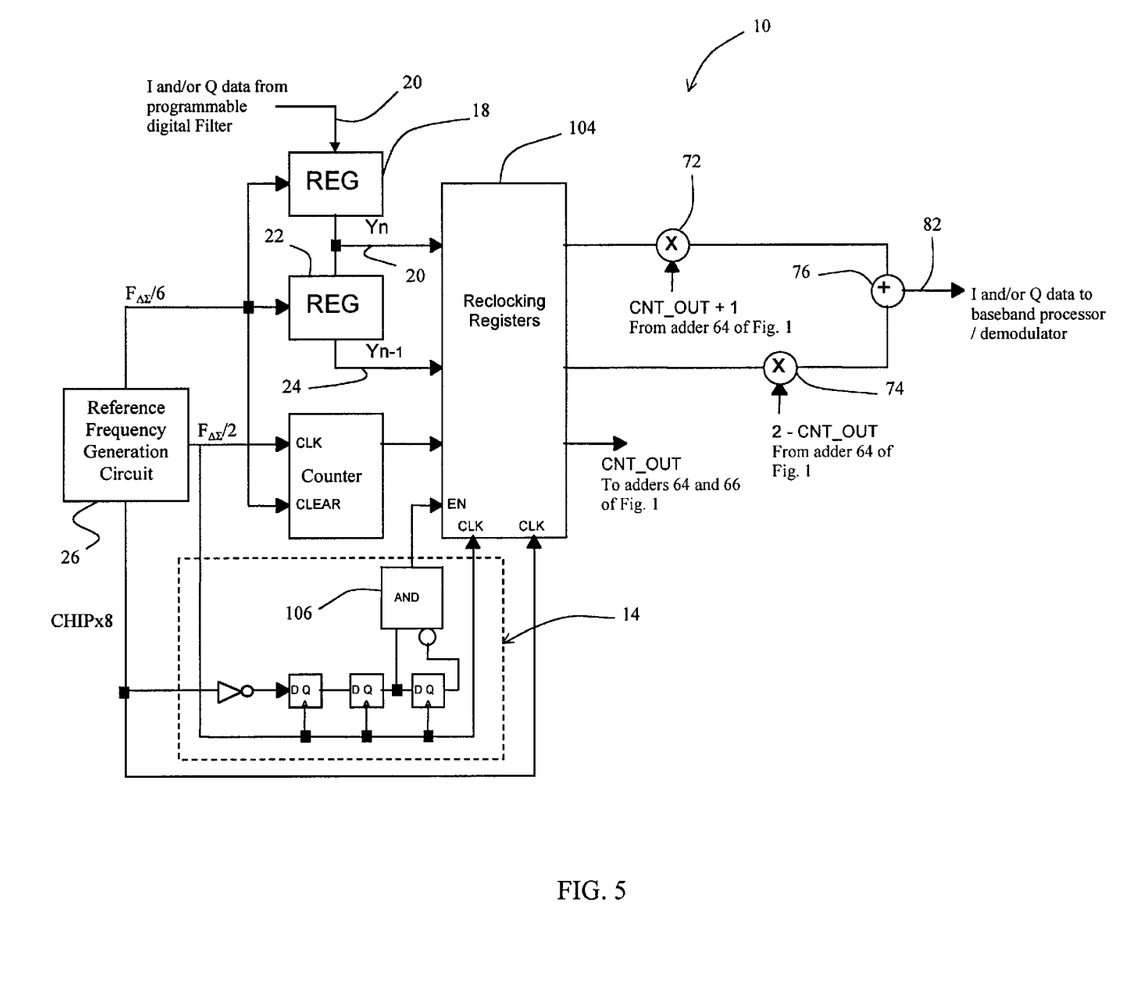
FIG. 5 is a more general diagram of the sample rate converter of FIG. 1.

FIG. 5 is a more general diagram of the sample rate converter 10 of FIG. 1. The selectively enabled registers 34, 36 and 60 and the rate conversion registers 38, 40, and 62 are shown as a set of re-clocking registers 104. Also, the NOR gate 50 of FIG. 1 is shown as an equivalent AND gate 106 having the opposite input negated.

Figure 6:
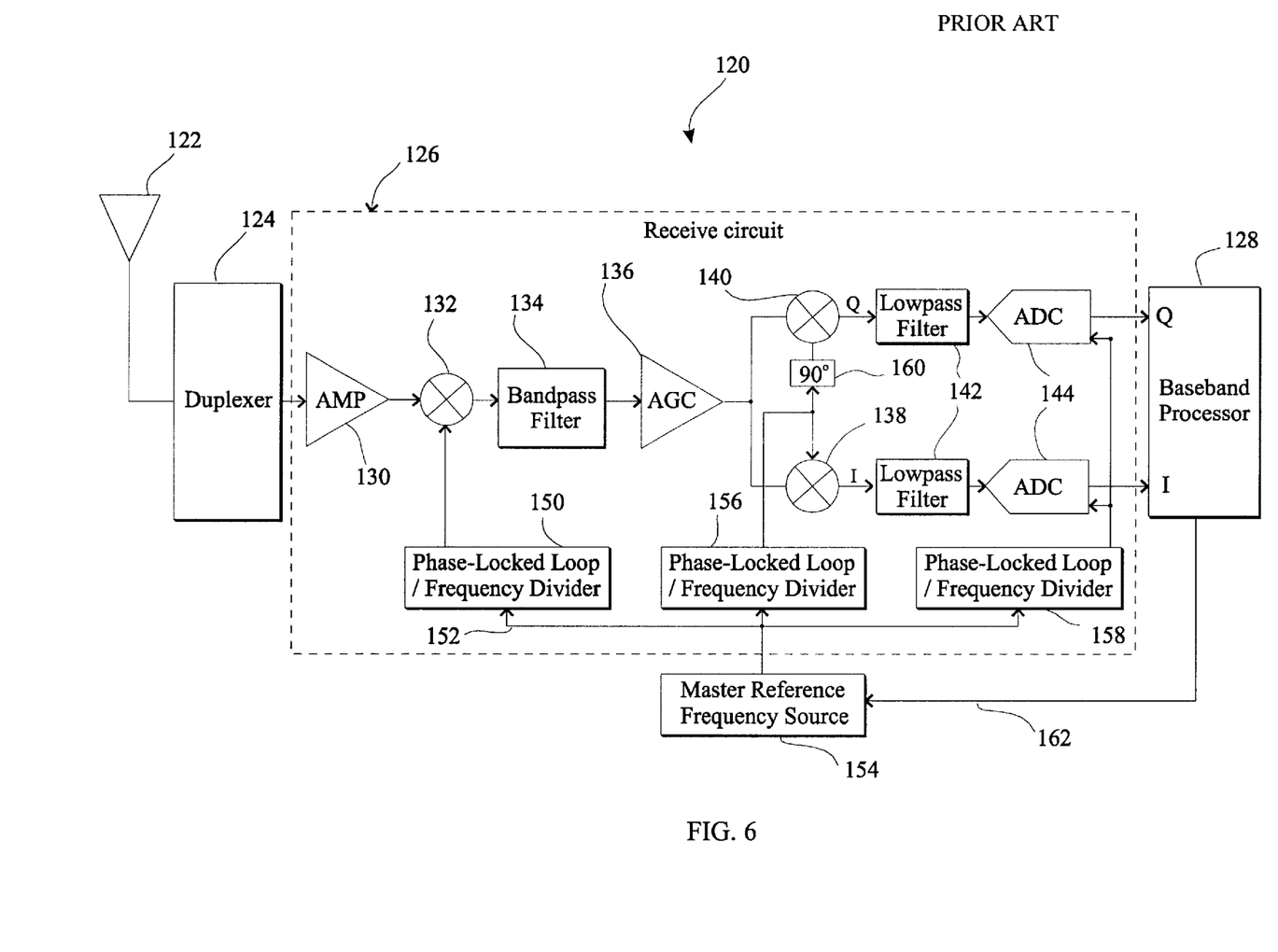
FIG. 6 is a diagram of a conventional telecommunications receiver.

FIG. 6 is a diagram of a conventional telecommunications receiver 120. The receiver 120 includes, from left to right, an antenna 122, a duplexer 124, a receive circuit 126, and a digital signal processor 128. A front end of the receive circuit 126 includes, from left to right, an amplifier 130, a radio frequency (RF)-to-intermediate frequency (IF) mixer 132, a bandpass filter 134, and an automatic gain control circuit (AGC) 136. The output of the AGC 36 is connected to a vector demodulator of the receive circuit that includes, from left to right, first 138 and second 140 IF-to-baseband mixers, lowpass filters 142, and analog-to-digital converters (ADCs) 144.

In operation, the antenna 122 receives a transmitted RF signal that is routed through the duplexer 124 and then input to the receive circuit 126. In the receive circuit 126, the received RF signal is amplified by the amplifier 130 and then converted to an IF signal via the RF-to-IF mixer 132. The resulting IF signal is filtered by the bandpass filter 134 and output to the AGC 136 where the gain of the signal is adjusted and input, in parallel, to the IF-to-baseband mixers 138, 140. The first 138 and second 140 IF-to-baseband mixers output in-phase (I) and quadrature (Q) signal components of the IF signal, respectively. The I and Q signals are then filtered by the lowpass filters 142 and converted to digital signals 150 via the ADCs 144.

The RF-to-IF mixer 132, the IF-to-baseband mixers 138 and 140, and the ADCs 144 all require a frequency reference input to successfully perform their tasks, allowing the receiver 120 to lock on to a received signal and perform the necessary frequency conversions. A first local oscillator, i.e., phase-locked loop/frequency divider (PLL) 150 supplies the RF-to-IF mixer 132 with a reference frequency by phase-locking the output of the PLL 132 to a predetermined multiple of the frequency of a master reference signal 152 from a master reference frequency source 154. Similarly, second 156 and third 158 PLLs supply the IF-to-baseband mixers 138, 140 and the ADCs 144 with reference frequencies derived from the master reference signal 152, respectively. A ninety degree phase shifter 160 shifts the phase of the reference frequency output of the second PLL 156 by ninety degrees for use by the second IF-to-baseband mixer 140.

The master reference frequency source 154 is typically a voltage-controlled temperature-compensated crystal oscillator (VC-TCXO). The frequency of the master reference signal 152 is adjustable via a frequency control signal 162 from the DSP 128 in response to signal reception errors detected by the DSP 128.

The analog phase-locked loop/frequency dividers 150, 156, and 158, the mixers 138 and 140, and the lowpass filters 142 represent expensive analog circuits that consume excess power.

Figure 7:
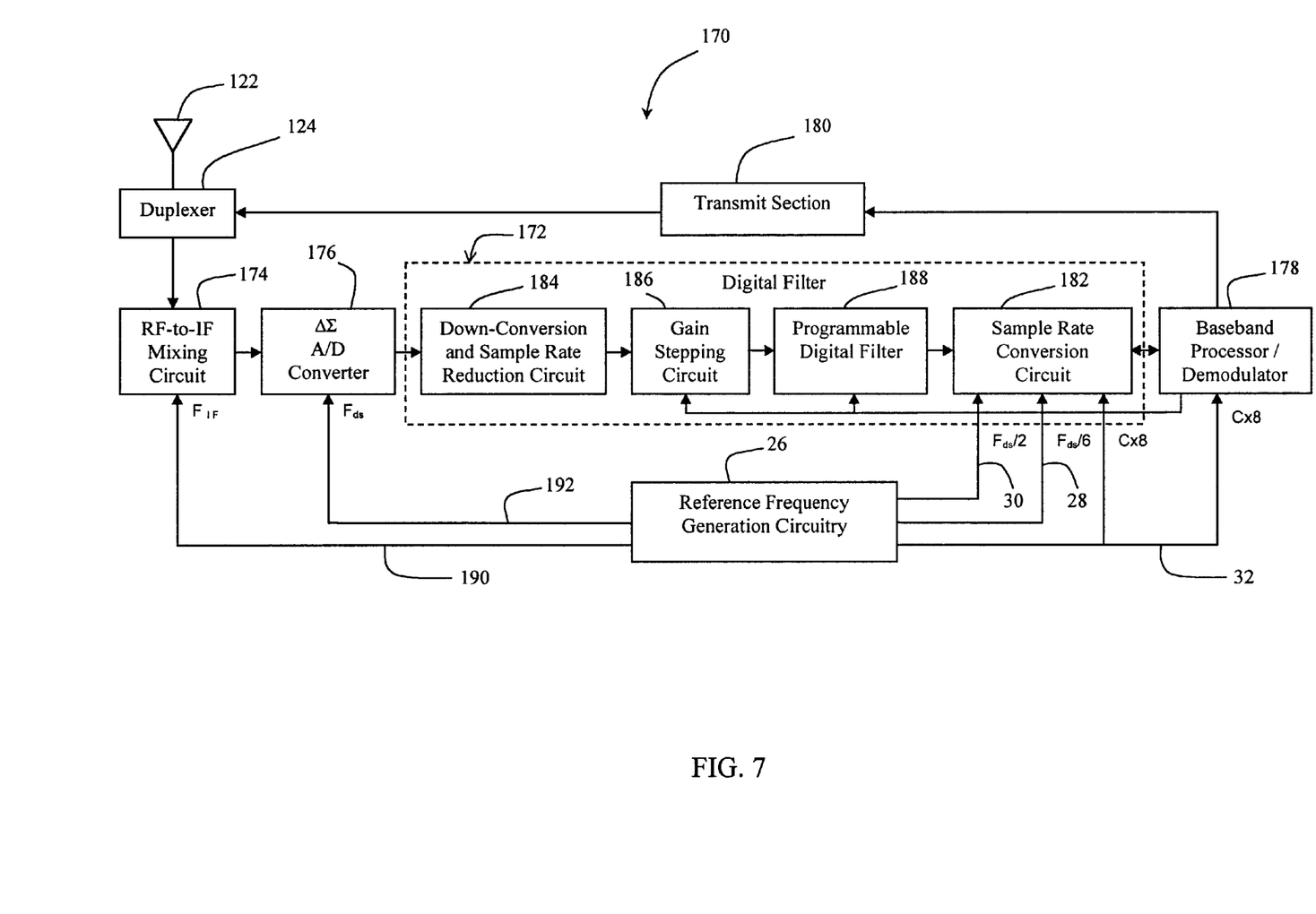
FIG. 7 is a diagram of a telecommunications transceiver constructed in accordance with the teachings of the present invention and employing the sample rate converter of FIG. 1 within a digital filter.

FIG. 7 is a diagram of a telecommunications transceiver 170 constructed in accordance with the teachings of the present invention and employing the sample rate converter 10 of FIG. 1 within a sample rate conversion circuit 182 within a digital filter 172. The transceiver 170 includes, from left to right, the antenna 122, the duplexer 124, an RF-to-IF mixing circuit 174, a delta-sigma analog-to-digital converter (_ADC) 176, the digital filter 172, and a baseband processor/demodulator 178. An output of the baseband processor/demodulator 178 is provided to a transmit section 180, the output of which is connected to the duplexer 124. The reference frequency generation circuit 26 is connected to the RF-to-IF mixing circuit 174, the _ADC 176, the digital filter 172, and the baseband processor/demodulator 178, and supplies necessary reference frequencies thereto.

The digital filter 172 includes, from left to right, a digital downconversion and sample rate reduction circuit 184, a gain stepping circuit 186, a programmable digital filter 188, and the sample rate conversion circuit 182.

In operation, the antenna 122 is used for both radio transmission and reception. The duplexer 124 facilitates the dual use of the antenna 122 for both reception and transmission. Upon receipt of an RF signal by the antenna 122, the duplexer 124 directs the received signal to the RF-to-IF mixing circuit 174 where the RF signal is converted to an IF signal. In the present embodiment, the RF-to-IF mixing circuit 174 is similar to the amplifier 130 and the IF mixer 132 of FIG. 6.

The resulting IF signal is input to the _ADC 176 where it is converted to a digital signal. The _ADC 176 includes a delta-sigma modulator in series with a 1-bit digital to analog converter (not shown), the constructions of which are well known in the art. The _ADC 176 is chosen to have a high dynamic range so as to prevent undesirable distortion resulting from converting the relatively high frequency IF signal to a digital signal. The _ADC 176 outputs a digital IF frequency signal to the digital filter 172.

In the digital filter 172, the digital IF frequency signal is down-converted to baseband frequencies by the downconversion and sample rate reduction circuit 184. The downconversion and sample rate reduction circuit 184 also separates the digital IF frequency signal into digital in-phase (I) and quadrature (Q) signals. The gain of the resulting digital I and Q baseband signals is adjusted in the gain stepping circuit 186. The gain stepping circuit is connected to the baseband processor/demodulator 78.

Subsequently, the programmable digital filter 188 attenuates jammer signals and other undesirable signals in the gain-adjusted I and Q digital baseband signals. The digital programmable filter 188 is also designed to equalize the composite phase response of the digital filter 172, compensate for passband droop, and remove any DC offsets present in the gain-adjusted I and Q digital baseband signals.

Digital filters required to perform the tasks implemented by the downconversion and sample rate reduction circuit 184, the gain stepping circuit 186, and the programmable digital filter 188 may be constructed by those ordinarily skilled in the art. However, in the preferred embodiment, the digital programmable filter 188 is constructed in accordance with the teachings of U.S. patent application Ser. No. 09/211,990, filed Dec. 14, 1998, by Mathe, Lemart, entitled LOW-CURRENT PROGRAMMABLE DIGITAL FILTER, assigned to the assignee of the present invention and incorporated by reference herein.

Filtered I and Q signals are output from the programmable digital filter 188 and to the sample rate conversion circuit 182. In the sample rate conversion circuit 182, the sample rate of the I and Q signals is converted to the chip rate, i.e., CHIP×8, in preparation for despreading and further processing in the baseband processor/demodulator 178. The sample rate conversion circuit 182 rate matches the output of the digital filter 172 to the chip rate at the baseband processor/demodulator 178.

The baseband processor/demodulator 178 also provides programmable coefficients from a memory (not shown) in the baseband processor/demodulator 178 such as a register, to the programmable digital filter 188. In addition, the baseband processor/demodulator 178 outputs data such as voice or other information to the transmit section 180.

The transmit section 180 includes mixers, up-converters, filters, and so on (not shown) and may be constructed by those ordinarily skilled in the art. The transmit section 80 prepares the signal output from the baseband processor/demodulator 178 for radio transmission. The prepared signal is transmitted via the antenna 122 by way of the duplexer 124.

The RF-to-IF mixer 174 requires an IF clock signal 190 that is supplied by the reference frequency generation circuit 26. The _ADC 176 requires an F_ clock signal 192 with a frequency of F_, which corresponds to the sample rate of signals output from the _ADC 176. The F_ clock signal 192 is also supplied by the reference frequency generation circuit 26. Similarly, the reference frequency generation circuit 26 supplies the F_/6 clock signal 28, the F_/2 clock signal 30, and the CHIP×8 clock signal 32 to the sample rate conversion circuit 182. The CHIP×8 clock signal 32 is also supplied to the baseband processor/demodulator 178.

The reference frequency generation circuit 26 may be constructed by those ordinarily skilled in the art via one or more direct digital synthesizers and/or phase locked loops and a frequency reference such as a voltage controlled temperature compensated crystal oscillator (VC-TCXO).

Use of the sample rate conversion circuit 182 facilitates implementation of a digital filter such as the digital filter 172 in the transceiver 170 having any F_ frequency and any IF frequency. Use of the sample rate conversion circuit 182 facilitates the accommodation of the different frequencies of the F_ clock signal 192 and IF clock signal 190. This is due to the fact that the sample rate converter 182 can handle arbitrary frequency relations.

By implementing the gain adjusting, mixing, and filtering functions of the automatic gain control circuit 136, the IF-to-baseband mixers 138 and 140 and the lowpass filters 142 of FIG. 6 in the digital domain via the power-efficient digital filter 172, significant size and energy consumption advantages are obtained. In addition, gain and phase mismatch problems inherent in the receiver 120 of FIG. 6 are effectively eliminated in the transceiver 170.

Figure 8:
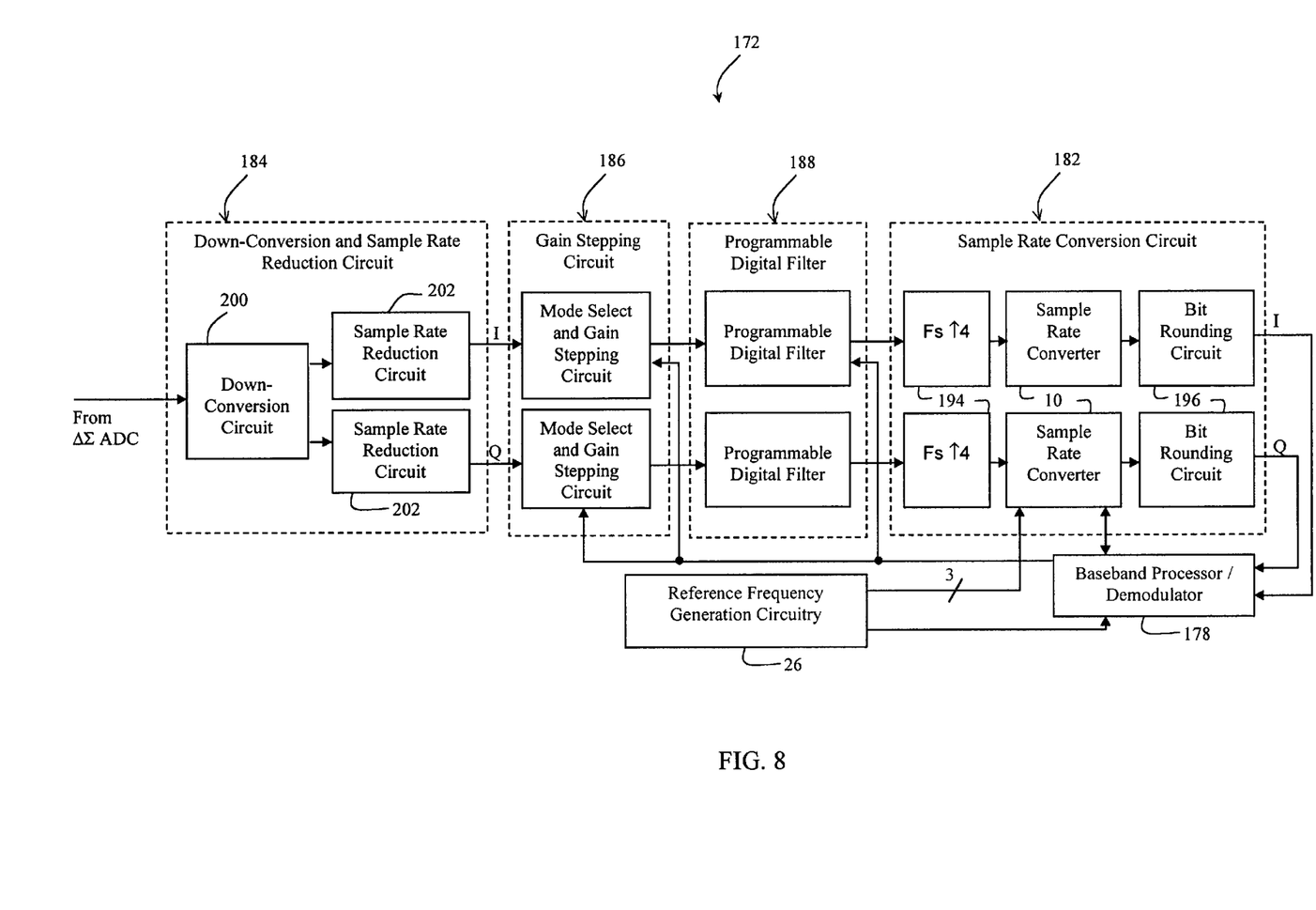
FIG. 8 is a more detailed diagram of the digital filter of the transceiver of FIG. 7.

FIG. 8 is a more detailed diagram of the digital filter 172 of the transceiver 170 of FIG. 7. The downconversion and sample rate reduction circuit 184 receives a digital IF input from the _ADC of FIG. 7. The sample rate reduction circuit 184 includes a downconversion circuit 200 and two parallel sample rate reduction circuits 202. The digital IF input is converted to baseband digital signals, sample rate reduced by a factor of 6, and split into I and Q digital signals by the downconversion circuit 200. The I signals are input to one sample rate reduction circuit 202 and the Q signals are input to the other sample rate reduction circuit 202, where the sample rate of the I and Q signals is reduced by a factor of 4.

In the present embodiment, the downconversion and sample rate reduction circuit 184 is implemented via polyphase decimators, the constructions of which are well known in the art.

In the subsequent gain stepping circuit 186, the I and Q signals are multiplied by a programmable gain factor. The gain factor may be controlled via the baseband processor/demodulator 178. The gain stepping circuit 186 is implemented with one or more digital multipliers.

In the subsequent programmable digital filter 188, jammers are removed from the I and Q signals and the passband is equalized for passband droop and phase response. The filter is programmable for sample rates F_ in the range of 60 to 80 MHz.

The subsequent sample rate conversion circuit 182 includes, from left to right, includes two interpolators 192, one for the I signals, and one for the Q signals, two sample rate converters 10, and two bit rounding circuits 196. The interpolators 192 increase the sample rate of the I and Q signals by a factor of 4. The interpolators 192 and are easily designed and constructed by those ordinarily skilled in the art. The resulting interpolated I and Q signals are input to the sample rate converters 10. The sample rate converters 10 are disclosed in FIG. 1. In the present embodiment, the sample rate converters 10 operate on the I and Q signals, which are characterized by a sample rate of F_/6 which is in the approximate range of 10 to 13.3 MHz. The F_/6 sample rate of the I and Q signals is converted to CHIP×8, which is approximately 9.8 MHz.

The subsequent bit rounding circuits 196 map the rate-converted CHIP×8 I and Q signals to 4-bit signals via bit truncation and associated filtering, which is a process well known in the art. The resulting 4-bit signals are output to the baseband processor/demodulator 178 for further processing.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,
What is claimed is:

1. A low power sample rate converter comprising:
   first means for providing an input signal characterized by a first sample rate and for providing a delayed version of said input signal;
   second means for periodically multiplying a first sample in said input signal by a first predetermined coefficient at a second sample rate and in accordance with a predetermined transfer function and providing a first signal in response thereto;
   third means for periodically multiplying a second sample in said delayed version of said input signal by a second predetermined coefficient at said second sample rate and in accordance with said predetermined transfer function and providing a second signal in response thereto; and
   fourth means for combining said first signal and said second signal and providing a rate-converted version of said input signal as an output signal in response thereto.

2. The invention of claim 1 wherein said delayed version of said input signal is delayed by one sample with respect to said input signal.

3. The invention of claim 2 further including a counter.

4. The invention of claim 3 wherein said counter is clocked by a first periodic signal having a first frequency related to said first sample rate by a predetermined fraction and cleared by a second periodic signal having a second frequency equivalent to said first sample rate, said counter producing a counter output at said first frequency.

5. The invention of claim 4 wherein said predetermined fraction is ⅓.

6. The invention of claim 4 wherein said first predetermined coefficient is equivalent to the sum of 1 and said counter output.

7. The invention of claim 6 wherein said second predetermined coefficient is equivalent to the difference of two and said counter output.

8. The invention of claim 7 wherein said fourth means includes an adder for adding said first signal and said second signal and providing said output signal in response thereto.

9. The invention of claim 1 wherein said predetermined transfer function is:

$(1+z^{-1}+z^{-2})^2$.

10. The invention of claim 1 wherein said predetermined transfer function is represented by the following coefficient sequence: [1 2 3 2 1].

11. A low power sample rate converter comprising:
    clock generation means for generating a first clock signal;
    input means for receiving an input signal characterized by a first sample rate;
    enable means for comparing said first clock signal to said input signal and providing an enable signal when said input signal is stable near an edge of a clock pulse in said first clock signal in response thereto;
    sample rate conversion means for sampling said input signal at a second sample rate and providing a rate-converted signal in response to said enable signal; and
    filter means for selectively multiplying said rate-converted signal by a predetermined coefficient and providing a sample rate converter output signal in response thereto.

12. The invention of claim 11 wherein said edge is a rising edge occurring in said first clock signal.

13. The invention of claim 11 wherein said filter means includes means for providing a count.

14. The invention of claim 13 wherein said means for providing a count includes a counter.

15. The invention of claim 14 wherein said counter includes means for receiving said first clock signal as an input and incrementing a count for each clock pulse received via said first clock signal, said count reset every pulse from a second clock having a frequency approximately equal to said first sample rate.

16. The invention of claim 15 wherein said filter means further includes means for inserting a time delay, said means for inserting a time delay clocked by said first clock signal.

17. The invention of claim 16 wherein said means for inserting a time delay is a register.

18. The invention of claim 17 wherein said register includes one or more flip-flops.

19. The invention of claim 16 wherein an input of said register is connected to an output of said counter, said register outputting said count in response to a high pulse in said first clock signal when said count is provided at said input by said counter.

20. The invention of claim 16 wherein said filter means further includes second means for inserting a time delay, said second means for inserting a time delay connected to an output of said first means for inserting a time delay, said second means for inserting a time delay clocked at said second sample rate.

21. The invention of claim 13 wherein said filter means further includes means for simulating zero insertion in said rate-converted signal without inserting zeros within said rate-converted signal.

22. The invention of claim 21 wherein said filter means further includes a means for selectively adding a first predetermined constant to said count and/or subtracting a second predetermined constant from said count, and providing a first output signal and/or a second output signal in response thereto, respectively.

23. The invention of claim 22 wherein said means for selectively adding includes an adder and a subtractor, said count provided to a first input of said adder and to a first input of said subtractor.

24. The invention of claim 23 wherein a second input of said adder is connected to a voltage source representative of said first predetermined constant, an output of said adder providing said second output signal.

25. The invention of claim 24 wherein said first predetermined constant is 1.

26. The invention of claim 23 wherein a second input of said subtractor is connected to a voltage source representative of said second predetermined constant, an output of said subtractor providing said first output signal.

27. The invention of claim 26 wherein said second predetermined constant is 2.

28. The invention of claim 22 wherein said filter means further includes a first multiplier and a second multiplier, said first multiplier receiving said first output signal as a first input, and said second multiplier receiving said second output signal as a first input.

29. The invention of claim 28 wherein a second input of said first multiplier receives said rate-converted signal.

30. The invention of claim 29 wherein a second input of said second multiplier receives a delayed version of said rate-converted signal.

31. The invention of claim 30 wherein said delayed version of said rate-converted signal is delayed by an amount equivalent to a time difference between successive samples of a signal characterized by said first sample rate.

32. The invention of claim 31 wherein outputs of said first multiplier and said second multiplier are input to a second adder, said second adder outputting said sample rate converter output signal.

33. The invention of claim 1 wherein said predetermined filter coefficient is to one of the following numbers: 1 2 3.

34. A low power sample rate converter comprising:

a first input register clocked at a first rate;

a second register clocked at said first rate and connected in series to said first input register;

a counter clocked at a second rate and cleared at said first rate;

a first set of reclocking registers clocked at a second rate and connected to said first input register, said second register, and said counter and providing a first output signal, second output signal, and third output signal, respectively, in response thereto;

a second set of reclocking registers clocked at a third rate and connected to said first set of reclocking registers and providing a first output, second output, and third output corresponding to said first output signal, said second output signal, and said third output signal, respectively;

an adder circuit connected at an output of said counter, said adder circuit including a first adder and a second adder for adding a first predetermined value and a second predetermined value to said output of said counter and providing a first coefficient output and a second coefficient output, respectively;

a multiplier circuit having a first multiplier and a second multiplier connected to said first output and said second output and to said first coefficient output and said second coefficient output, respectively, and providing a first multiplier output and a second multiplier output; and an output adder connected to said first multiplier output and said second multiplier output and providing a sample rate converter output.

35. A low power sample rate converter comprising:

first means for providing an input signal characterized by a first sample rate and for providing a delayed version of said input signal;

second means for periodically multiplying a first sample in said input signal by a first predetermined coefficient at a second sample rate and providing a first signal in response thereto;

third means for periodically multiplying a second sample in said delayed version of said input signal by a second predetermined coefficient at said second sample rate and providing a second signal in response thereto; and fourth means responsive to said second signal for providing a rate-converted version of said input signal.

36. A method for effecting sample rate conversion comprising the steps of:

providing an input signal characterized by a first sample rate and for providing a delayed version of said input signal;

periodically multiplying a first sample in said input signal by a first predetermined coefficient at a second sample rate and in accordance with a predetermined transfer function and providing a first signal in response thereto;

periodically multiplying a second sample in said delayed version of said input signal by a second predetermined coefficient at said second sample rate and in accordance with said predetermined transfer function and providing a second signal in response thereto; and combining said first signal and said second signal and providing a rate-converted version of said input signal as an output signal in response thereto.

* * * * *